United States Patent [19]

Ribner et al.

[11] Patent Number: 5,682,161
[45] Date of Patent: Oct. 28, 1997

[54] HIGH-ORDER DELTA SIGMA MODULATOR

[75] Inventors: David Byrd Ribner, Andover, Mass.; David Henry Kenneth Hoe, Schenectady, N.Y.

[73] Assignee: General Electric Company, Schenectady, N.Y.

[21] Appl. No.: 650,281

[22] Filed: May 20, 1996

[51] Int. Cl.$^6$ .................................................. H03M 3/02
[52] U.S. Cl. .................................................. 341/143
[58] Field of Search ........................... 341/143, 76, 77; 375/27, 29, 33

[56] References Cited

U.S. PATENT DOCUMENTS

| | | | |
|---|---|---|---|
| 5,065,157 | 11/1991 | Ribner et al. | 341/143 |
| 5,103,229 | 4/1992 | Ribner | 341/143 |
| 5,117,234 | 5/1992 | Shizawa | 341/143 |
| 5,124,703 | 6/1992 | Kaneaki et al. | 341/77 |
| 5,142,286 | 8/1992 | Ribner et al. | 341/143 |
| 5,148,166 | 9/1992 | Ribner | 341/143 |
| 5,181,032 | 1/1993 | Ribner | 341/143 |
| 5,187,482 | 2/1993 | Tiemann et al. | 341/143 |
| 5,283,578 | 2/1994 | Ribner et al. | 341/143 |
| 5,563,535 | 10/1996 | Corry et al. | 327/105 |

*Primary Examiner*—Brian K. Young
*Attorney, Agent, or Firm*—Marvin Snyder

[57] ABSTRACT

A delta-sigma modulator includes, in one embodiment, cascaded unit-delay integrators, the number of which is selected depending upon the order desired. The modulator further includes an n-bit (or multi-bit) A/D converter coupled to the output of the last cascaded integrator, and an n-bit (or multi-bit) D/A converter coupled to the output of the A/D converter. A truncator also is coupled to the output of the A/D converter. Truncation error correction is performed digitally by a truncation corrector. A one-bit D/A converter provides feedback from the output of the truncator to differential summing junctions interposed at the input of each unit-delay integrator. The multi-bit D/A converter output signal is fed back to differential summing junctions at the input of the third order and higher unit-delay integrators. The multi-bit D/A converter requires no digital correction of its linearity and only unit-delay integrators are used so that N-1 delay free integrators do not all have to settle within one clock period. The modulator therefore utilizes multiple quantizer bits to provide increased converter resolution and is stable at high orders.

10 Claims, 6 Drawing Sheets

HIGH-ORDER DELTA SIGMA MODULATOR

FIELD OF THE INVENTION

This invention relates generally to high-order delta sigma ($\Delta$-$\Sigma$) analog-to-digital (A/D) converters and, more particularly, to high-order delta-sigma converters using multi-bit quantizers.

BACKGROUND OF THE INVENTION

High resolution analog-to-digital (A/D) signal conversion can be achieved with lower resolution components through the use of over sampled interpolative (or delta sigma) modulation followed by digital low pass filtering and decimation. Oversampling refers to operation of the modulator at a rate many times greater than the Nyquist rate. Decimation refers to decreasing the sample rate of a signal by appropriate filtering and resampling.

Delta sigma modulators (sometimes referred to as sigma delta modulators) have been used in A/D converters for some time. In general, a delta sigma A/D converter uses an internal A/D converter of modest resolution and a complementary digital-to-analog (D/A) converter in a feedback loop. The feedback loop increases the accuracy of the A/D converter in a manner consistent with the high speed operation afforded by the internal A/D converter.

In known delta sigma A/D converters, resolution is predominantly governed by three factors: the ratio of the modulator clock to the Nyquist rate (typically referred to as the oversampling ratio), the "order" of the modulator, and the number of quantizer bits used in the delta sigma modulator. Order in this context is analogous to the order of a frequency selective filter and indicates the relative degree of spectral shaping that is provided by the modulator. A "high order" analog-to-digital converter is a third or higher order network.

The number of quantizer bits refers to the number of bits converted to analog form and fed back in a feedback loop. It is desirable to use a multi-bit quantizer for increased resolution; however, since the linearity of the D/A converter in the feedback loop must match the required linearity for the delta sigma A/D converter, most known delta sigma A/D converters simply use single-bit A/D converters and D/A converters.

Recently, delta-sigma modulators have been proposed which use a multi-bit A/D converter and a single bit D/A converter to avoid the high linearity requirement for a multi-bit D/A converter. Since the truncation error obtained when converting from a multi-bit digital signal to a single-bit analog signal is a known quantity, such error can be cancelled by digital processing. However, since such modulators are not stable at high orders, it is not practical to implement such a modulator in an order higher than second order.

Third-order modulators using both multi-bit and single-bit D/A converters are also known. Linearity requirements for multi-bit D/A converters are reduced since the output of the multi-bit D/A converter is fed back only to the third stage. Any error introduced by the multi-bit D/A converter is at least second-order noise shaped. This type of third order modulator is stable because the one-bit D/A converter effectively operates as a second order system. The quantization error of the multi-bit A/D converter is third-order shaped.

A drawback of third-order modulators using both multi-bit and single-bit D/A converters, however, is that an Nth order system uses N-1 delay-free integrators in series, i.e., cascaded. With such an architecture, the N-1 integrators are required to settle within one clock cycle, which requires high current and corresponding high power dissipation. In addition, in such a cascade configuration, at least some integrators (e.g., in third and higher order modulators) do not have a full clock period to settle and the clock frequency is limited to allow such higher order integrators to settle within the required time.

It would be desirable to provide a delta sigma A/D converter having multiple quantizer bits to increase converter resolution, and which is stable at high orders. It also would be desirable to provide such a converter which does not require N-1 integrators to all settle within one clock cycle.

SUMMARY OF THE INVENTION

An improved delta-sigma modulator includes, in one embodiment, cascaded unit-delay integrators, the number of which may be selected depending upon the order desired. The modulator further includes an n-bit (or multi-bit) A/D converter coupled to the output of the last cascaded integrator, and an n-bit (or multi-bit) D/A converter is coupled to the output of the A/D converter. A truncator is also coupled to the output of the A/D converter to perform truncation error correction. A 1-bit D/A converter is coupled to the output of the truncator and the output of the 1-bit D/A converter is coupled in a feedback loop to differential summing junctions interposed at the input of each cascaded unit-delay integrator. The output of the multi-bit D/A converter is coupled in a feedback loop to differential summing junctions at the input of the third order and higher unit-delay integrators.

For an Nth order system, the feedback coefficients $\alpha_i$ from the one-bit D/A converter are:

$$\alpha_i = \binom{N}{i} = \frac{N!}{i! \cdot (N-i)!} \quad (1)$$

and the feedback coefficients $\beta_i$ from the n-bit D/A converter are:

$$\beta_i = \binom{N-2}{i} = \frac{(N-2)!}{i! \cdot (N-2-i)!} \quad (2)$$

The modulator, as described hereinafter in more detail, has a zero at $\alpha=\frac{1}{2}$ and a pair of poles at $z=1$, which ensures that the modulator root locus will stay within the unit circle. The modulator therefore is unconditionally stable even at high orders. Further, the quantization noise is sinusoidally shaped to the Nth order. Thus, errors introduced by the multi-bit D/A converter are second-order noise shaped, which reduces linearity requirements for the multi-bit D/A converter.

The above described modulator includes a multi-bit D/A converter, yet requires no digital correction and enables use of only unit-delay integrators so that N-1 delay free integrators do not all have to settle within one clock period. The modulator therefore has multiple quantizer bits to increase converter resolution and is stable at high orders.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION

The resolution of delta sigma converters is given by the relationship:

$$\text{Bits} = (L + 1/2)\log_2 R - \log_2 \left[ \frac{\pi^L}{\sqrt{2L+1}} \right] + \log_2(2^Q - 1) \quad (3)$$

where "Bits" is the number of bits produced by the converter, "R" is the modulator oversampling ratio, "L" is the order of the modulator and "Q" is the number of quantizer bits used in the modulator. Resolution therefore is predominantly governed by three factors: the oversampling ratio R, the "order" L of the modulator, and the number Q of quantizer bits. As established in Equation 3, increasing the number Q of quantizer bits increases modulator resolution. However, since linearity in the D/A converter must match the linearity for the modulator, single-bit A/D and D/A converters are typically used.

Figure 1:
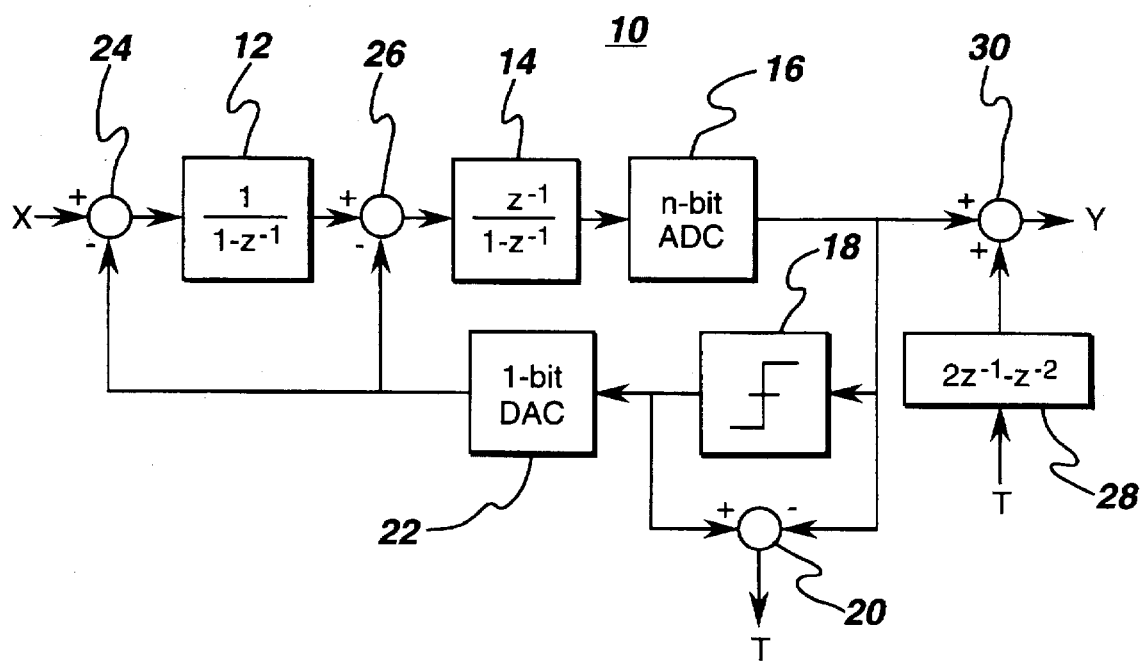
FIG. 1 is a schematic drawing of a second order modulator implementing truncation error cancellation.

FIG. 1 illustrates, in schematic form, a known second-order delta sigma modulator 10 configured to enable use of a multi-bit A/D converter with a single bit D/A converter. Specifically, modulator 10 includes a pair of cascaded integrators 12 and 14, and an n-bit A/D converter 16. First integrator 12 is a delay-free type integrator. Second integrator 14 is a unit-delay type integrator. The output of A/D converter 16 is coupled to a truncator 18 and the input and output of truncator 18 are coupled to a first differential summing junction 20. The output of truncator 18 is also coupled to a 1-bit D/A converter 22.

Second and third differential summing junctions 24 and 26 are coupled to receive output signals from D/A converter 22. Second differential summing junction 24 is also coupled to the input of modulator 10. Third differential summing junction 26 is interposed between first and second integrators 12 and 14.

With respect to the truncation error cancellation, the output of first differential summing junction 20 is supplied to a truncation corrector 28. The output of truncation corrector 28 is coupled to a fourth summing junction 30, which is also coupled to the output of n-bit A/D converter 16.

In operation, an input signal X to modulator 10 is sampled by the modulator at a sampling rate $F_M$. The input signal is supplied to second differential summing junction 24, and the output signal of junction 24 is integrated by cascaded integrators 12 and 14. The output signal from second integrator 14 is converted to digital form by n-bit A/D converter 16, and the multi-bit digital output signal from A/D converter 16 is supplied to truncator 18. Truncator 18 passes only the most significant bit produced by A/D converter 16 and supplies it to 1-bit D/A converter 22, from whence it is fed back, in analog form, to differential summing junctions 24 and 26. The most significant bit is also supplied to differential summing junction 20, where the full digital output signal from n-bit A/D converter 16 is subtracted from the most significant bit to obtain a value T. The value T is then supplied to truncation corrector 28, and the output signal of truncation corrector 28 is added, at summing junction 30, to the output signal of n-bit A/D converter 16. Modulator output signal Y is supplied to a digital filter and decimator (not shown) as is well-known, to complete the A/D conversion.

In the embodiment of FIG. 1, the instability introduced by using single bit digital-to-analog converter 22 with n-bit A/D converter 16 generally prevents implementing modulator 10 with more than two (2) cascaded integrators, i.e., a second order modulator. Limiting the order of modulator 10 also limits the resolution of modulator 10.

Figure 2:
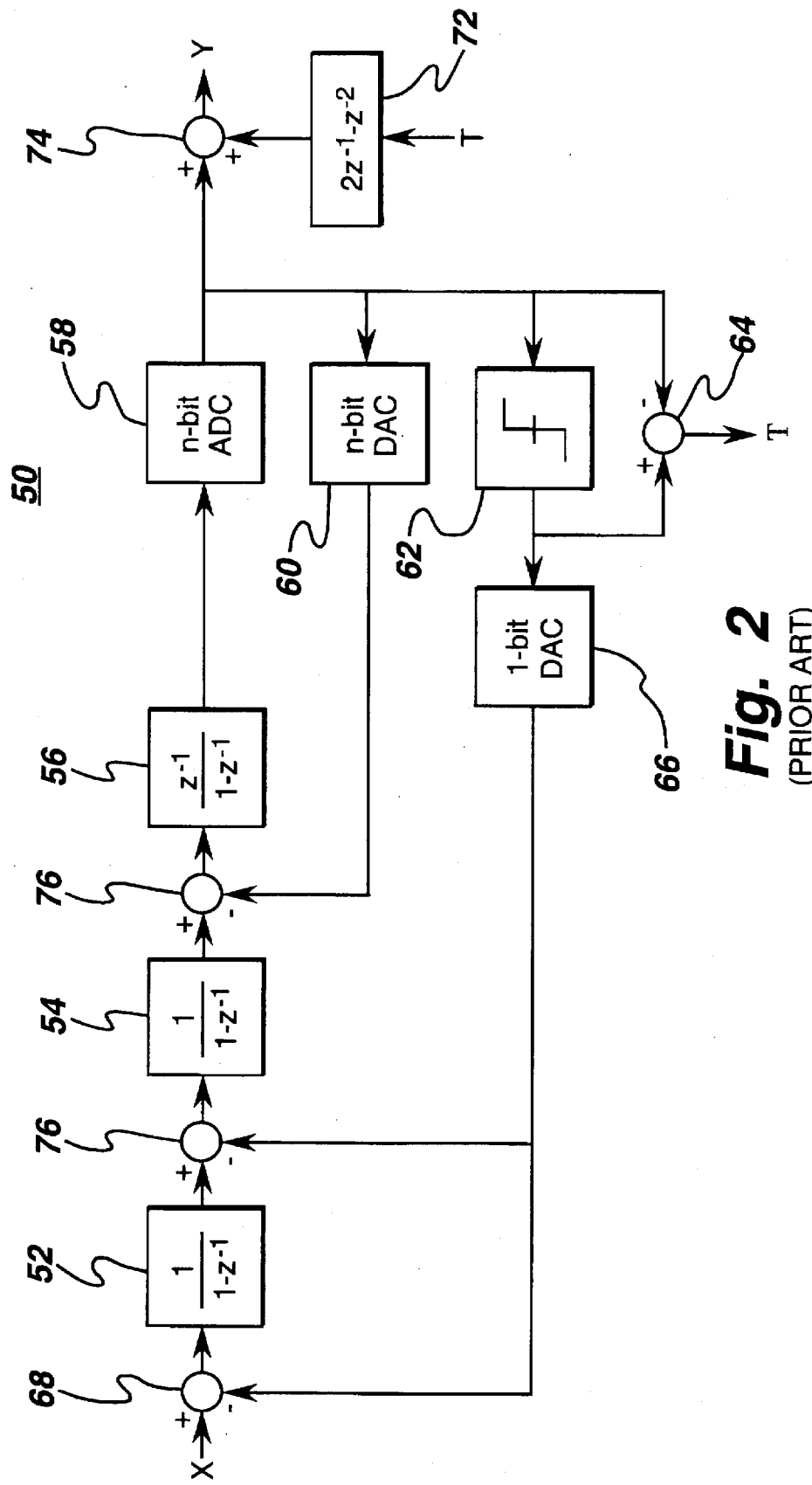
FIG. 2 is a schematic drawing of a multi-bit two path third order delta sigma modulator.

FIG. 2 illustrates, in schematic form, a known third order modulator 50 which uses both a multi-bit A/D converter and a single bit D/A converter. Modulator 50 is stable because the single bit D/A converter output signal is supplied only to the first and second order integrators. More specifically, modulator 50 includes three cascaded integrators 52, 54 and 56, and an n-bit A/D converter 58. First and second integrators 52 and 54 are delay-free type integrators. Third integrator 56 is a unit-delay type integrator. The output of A/D converter 58 is coupled to both an n-bit D/A converter 60 and to a truncator 62. The input and output of truncator 62 are coupled to a first differential summing junction 64. The output of truncator 62 is also coupled to a 1-bit D/A converter 66.

Second and third differential summing junctions 68 and 70 are coupled to receive the output of D/A converter 66. Second differential summing junction 68 also is coupled to the input of modulator 50. Third differential summing junction 70 is interposed between first and second integrators 52 and 54.

With respect to the truncation error cancellation, output signals from first differential summing junction 64 are supplied to a truncation corrector 72. Output signals from truncation corrector 72 are supplied to a fourth summing junction 74, which also is coupled to the output of n-bit A/D converter 58.

The output of n-bit D/A converter 60 is coupled to a fifth differential summing junction 76 interposed between second integrator 54 and third integrator 56. The linearity requirements for multi-bit D/A converter 60 are reduced since output signals of converter 60 are fed back only to third stage integrator 56. Any error introduced by multi-bit D/A converter 60 will at least be second-order noise shaped, and modulator 50 is stable because one-bit D/A converter 66 effectively operates with a second order system. The quantization error of multi-bit A/D converter 60, however, is third-order shaped.

Figure 3:
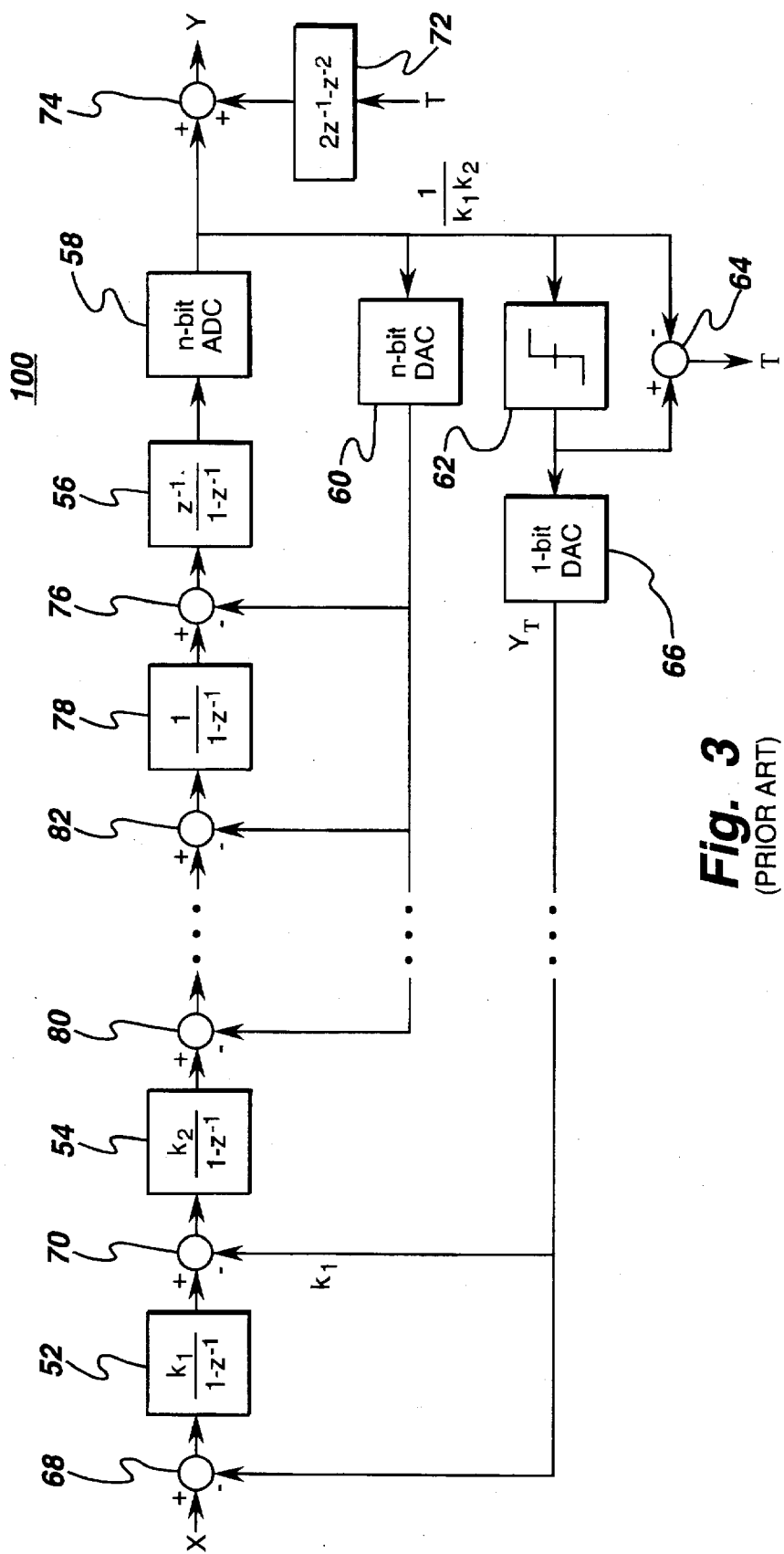
FIG. 3 is a schematic drawing of a multi-bit two path Nth order modulator with scaling.

As shown in FIG. 3, the structure of modulator 50 (FIG. 2) has been expanded in the prior art to result in a modulator 100 of arbitrary order. The difference between modulator 50 and modulator 100 is that modulator 100 is a third or higher order modulator. Specifically, modulator 100 includes a selected number of delay-free integrators 52, 54 and 78. First and second delay-free integrators 52 and 54 receive feedback from one-bit D/A converter 66 via differential summing junctions 68 and 70. Delay-free integrator 78 and unit-delay integrator 56 receive feedback signals from n-bit D/A converter 60 via differential summing junctions 82 and 76. Scaling coefficients $k_1$ and $k_2$ also are utilized in modulator 100.

If the feedback loop is broken at $Y_T$, the following transfer function is obtained:

$$Y = -Y_T \cdot \frac{2z-1}{(z-1)^2} \qquad (4)$$

Based on Equation 4, modulator 100 has a zero at $z=\frac{1}{2}$ and a pair of poles at $z=1$. The root locus of modulator 100 stays within a unit circle of $|z|=1$ for any loop gain. Such characteristics ensure the stability of modulator 100. Further, with respect to modulator 100, when cascaded integrators are used, the quantization noise is Nth order shaped. Stability is maintained because single bit D/A converter 66 is coupled to provide feedback signals to first and second integrators 52 and 54, i.e., second order feedback. A drawback of modulator 100 is that when the modulator is of N order, N-1 delay-free integrators are coupled in series. Therefore, N-1 integrators all must settle within one clock cycle. As explained above, such a cascade of delay-free integrators limits sampling frequency.

Figure 4:
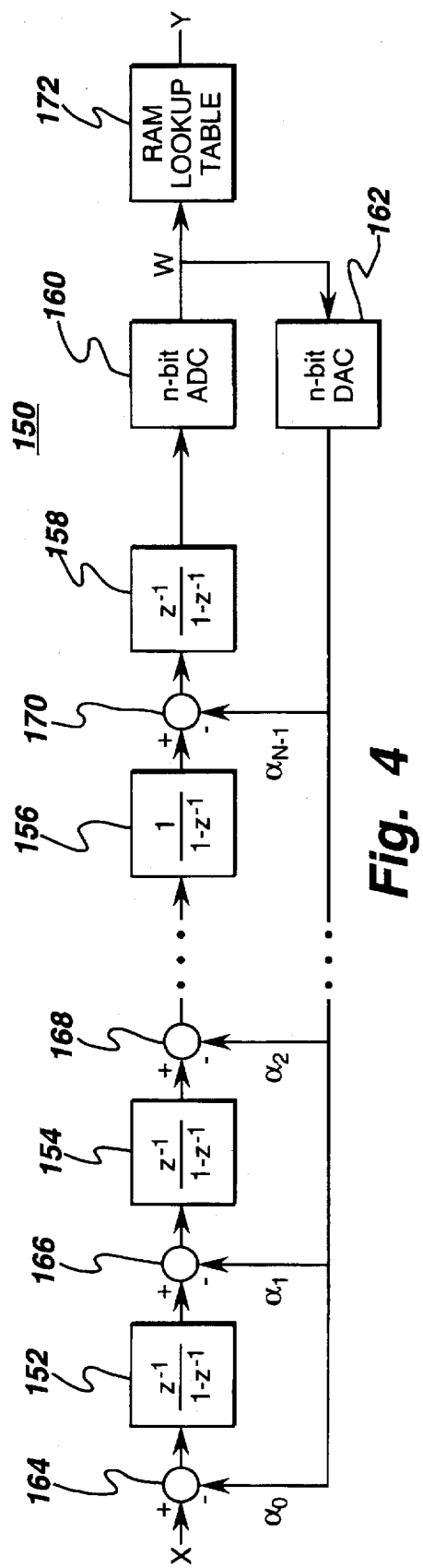
FIG. 4 is a schematic drawing of an Nth order delta sigma modulator with binomial coefficients.

A prior art modulator 150 of arbitrary high order having delay-free integrators and a unit-delay integrator is illustrated in FIG. 4. More specifically, modulator 150 includes cascaded delay-free integrators 152, 154 and 156, and a unit delay integrator 158. The output of unit delay integrator 158 is coupled to an n-bit A/D converter 160. An n-bit D/A converter 162 is coupled to the output of A/D converter 160, and the output of D/A converter 162 is fed back to differential summing nodes 164, 166, 168 and 170. Any error introduced by n-bit D/A converter 162 is determined by RAM lookup table 172 and subtracted from the output signal of n-bit A/D converter 160 to generate output signal Y. Use of such a RAM look-up table is sometimes referred to in the art as digital correction.

Although digital correction typically provides acceptable results, such correction may limit resolution by limiting sample frequency. Further, implementing a look-up table increases modulator costs. Rather than using digital correction, it would be desirable to provide a modulator which includes a multi-bit D/A converter, yet requires no such digital correction and enables use of only unit-delay integrators so that N-1 delay free integrators do not all have to settle within one clock period.

Figure 5:
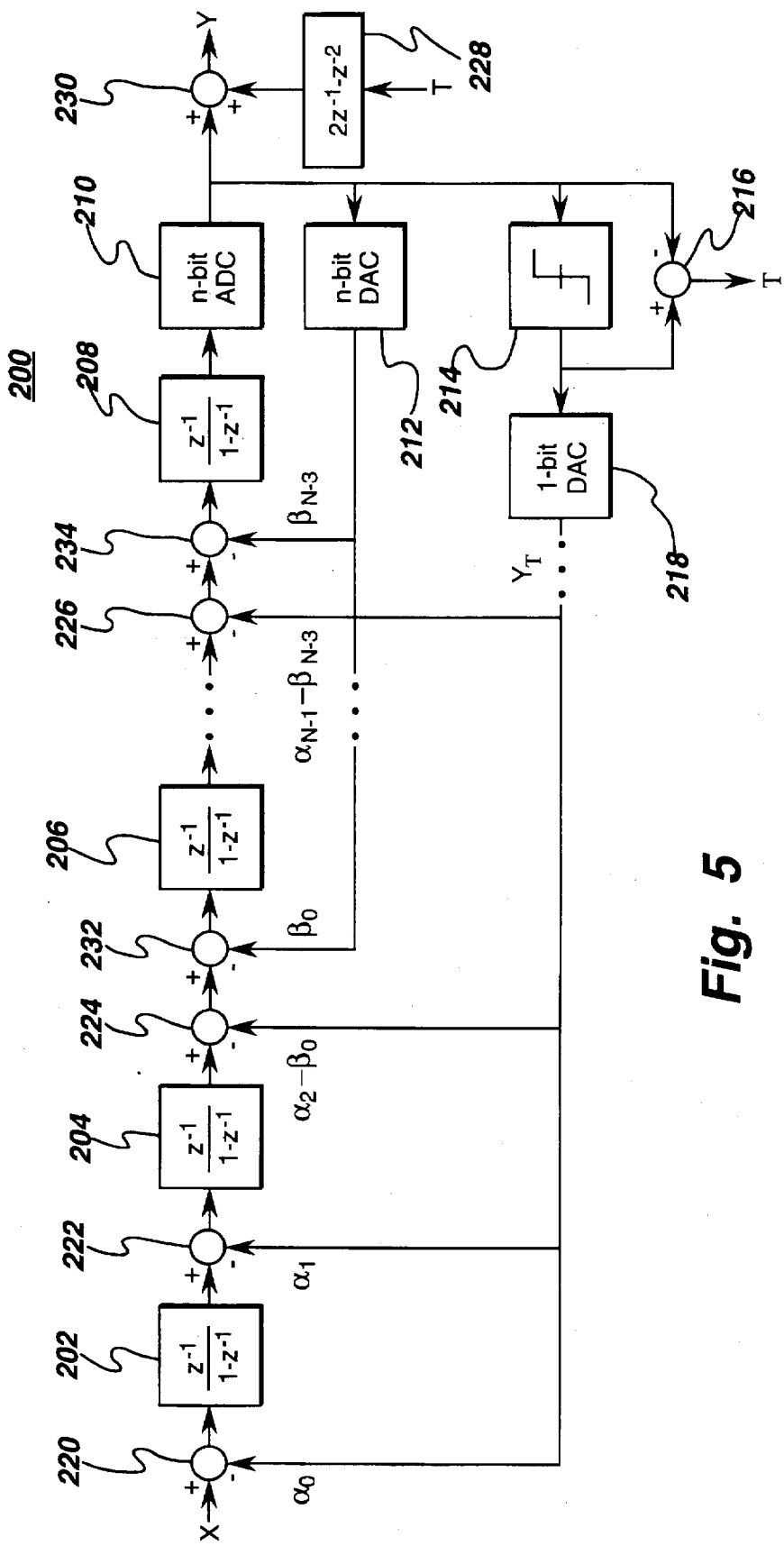
FIG. 5 is a schematic drawing of a multi-bit two path Nth order modulator with binomial coefficients.

One embodiment of a modulator 200 which uses a multi-bit D/A converter and a selected order of unit-delay integrators without requiting digital correction is shown in FIG. 5. In accordance with the invention, modulator 200 includes a multi-bit quantizer, or D/A converter, in a two-path architecture of high order, while using only unit-delay integrators. By using only unit-delay integrators, each integrator has a full clock period to settle and the modulator may operate at high frequencies. Thus modulator 200 includes cascaded unit-delay integrators 202, 204, 206 and 208. The number of cascaded unit-delay integrators may be selected depending upon the order desired. Modulator 200 further includes an n-bit A/D converter 210 coupled to the output of integrator 208. An n-bit D/A converter 212 and a truncator 214 are coupled to the output of n-bit A/D converter 210. Both the input and output of truncator 214 are coupled to a first differential summing junction 216. The output of truncator 214 is also coupled to a 1-bit D/A converter 218. The output of 1-bit D/A converter 218 is coupled to second differential summing junction 220, third differential summing junction 222, fourth differential summing junction 224 and fifth differential summing junction 226. For truncation error correction, the output of first differential summing junction 216 is coupled to a truncation corrector 228. The output of truncation error correction block 228 is coupled to sixth summing junction 230. The output of n-bit D/A converter 212 is coupled to seventh differential summing junction 232 and eighth differential summing junction 234.

For an Nth order system, the binomial feedback coefficients $\alpha_i$ are defined as:

$$\alpha_i = \binom{N}{i} = \frac{N!}{i! \cdot (N-i)!} \qquad (5)$$

for an Nth order modulator. The coefficients $\beta_i$ are defined as:

$$\beta_i = \binom{N-2}{i} = \frac{(N-2)!}{i! \cdot (N-2-i)!} \qquad (6)$$

Modulator 200 can be shown as being stable by breaking the feedback loop at $Y_T$ and determining the transfer function from this point to Y:

$$Y = -Y_T \cdot \left[ \sum_{i=0}^{N-1} \frac{\alpha_i}{(z-1)^{N-i}} - \sum_{i=0}^{N-3} \frac{\beta_i}{(z-1)^{N-2-i}} \right] - \qquad (7)$$

$$Y \sum_{i=0}^{N-3} \frac{\beta_i}{(z-1)^{N-2-i}} .$$

Equation 7 can be simplified by using the binomial expansion formula to obtain the following:

$$\left( \frac{z}{z-1} \right)^N - 1 = \sum_{i=0}^{N-1} \frac{\alpha_i}{(z-1)^{N-i}} \qquad (8)$$

$$\left( \frac{z}{z-1} \right)^{N-2} - 1 = \sum_{i=0}^{N-3} \frac{\beta_i}{(z-1)^{N-2-i}} . \qquad (9)$$

Therefore, equation (7) becomes:

$$Y = -Y_T \left[ \left( \frac{z}{z-1} \right)^N - \left( \frac{z}{z-1} \right)^{N-2} \right] - \qquad (10)$$

$$Y \left[ \left( \frac{z}{z-1} \right)^{N-2} - 1 \right]$$

$$Y \left( \frac{z}{z-1} \right)^{N-2} = -Y_T \cdot \frac{z^N - z^{N-2}(z-1)^2}{(z-1)^N} \qquad (11)$$

$$Y = -Y_T \cdot \frac{2z-1}{(z-1)^2} .$$

Based on the foregoing, it can be understood that modulator 200 has a zero at $z=\frac{1}{2}$ and a pair of poles at $z=1$, which ensures that the root locus will stay within the unit circle. Modulator 200 therefore is unconditionally stable.

For modulator 200 of Nth order, the signal at $Y_T$ is:

$$Y_T = z^{-N} X + (1-z^{-1})^N Q + (1-z^{-1})^2 T \qquad (12)$$

where Q is the quantization noise of multi-bit A/D converter 210 and T is the truncation error. The quantization noise is sinusoidally shaped to the Nth order. The errors introduced by multi-bit D/A converter 212 are second-order noise shaped, thus reducing the linearity requirements for converter 212.

Figure 6:
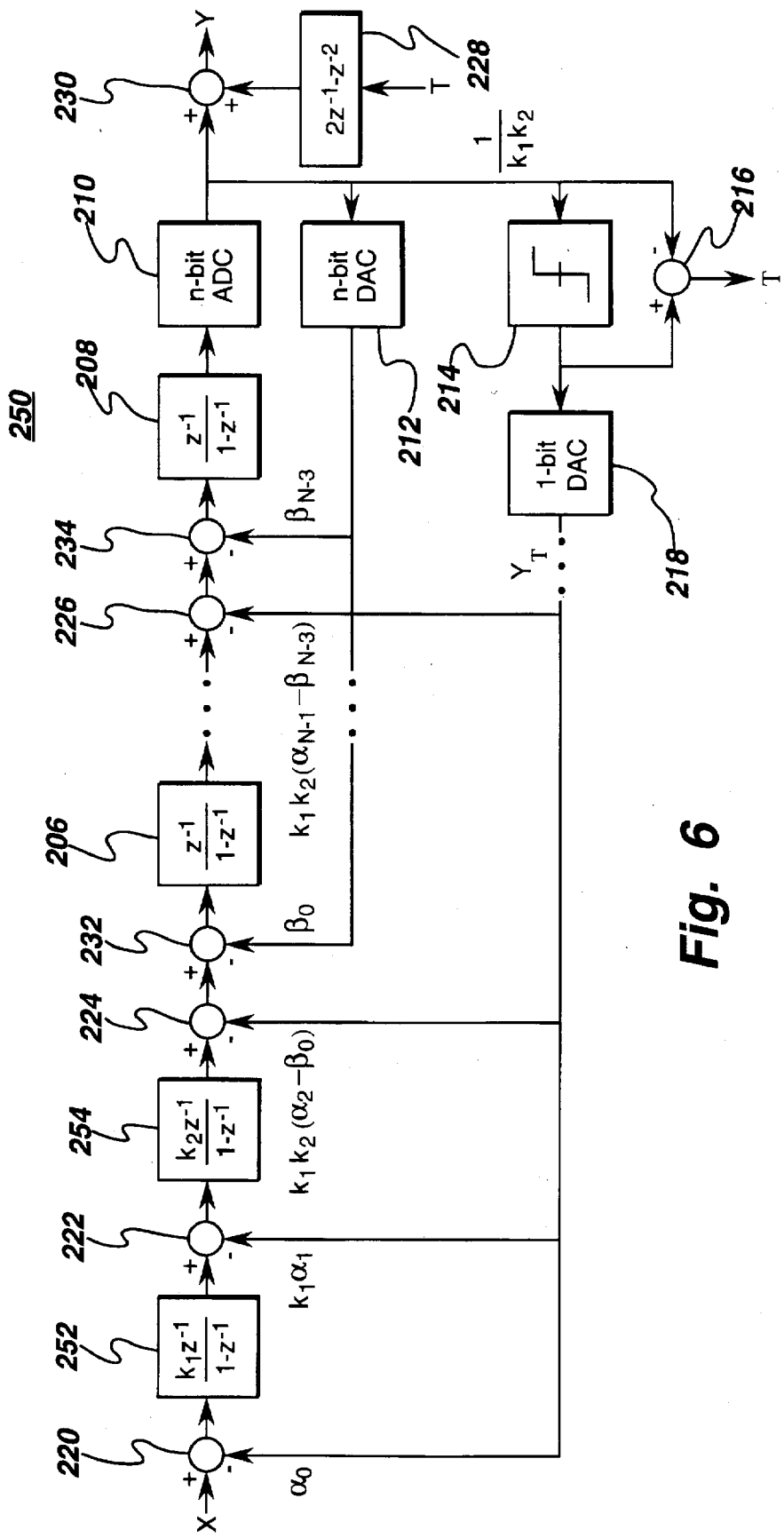
FIG. 6 is a schematic drawing of the modulator shown in FIG. 5, including scaling.

Another embodiment of a modulator 250 in accordance with the present invention is shown in FIG. 6. In modulator 250, first and second integrators 252 and 254 use scaling coefficients $k_1$ and $k_2$. As a result of using such scaling coefficients, after cancelling the truncation error in the digital domain, output signal $Y_{out}$, including the effect of scaling, is:

$$Y_{out} = z^{-N}X + \frac{1}{k_1 k_2} \cdot (1-z^{-1})^N Q. \quad (13)$$

Both modulators 200 and 250 include a multi-bit D/A converter, yet require no digital correction and enable use of only unit-delay integrator so that N-1 delay free integrators do not all have to settle within one clock period. Modulators 200 and 250 therefore have multiple quantizer bits to increase converter resolution and are stable at high orders.

Figure 7:
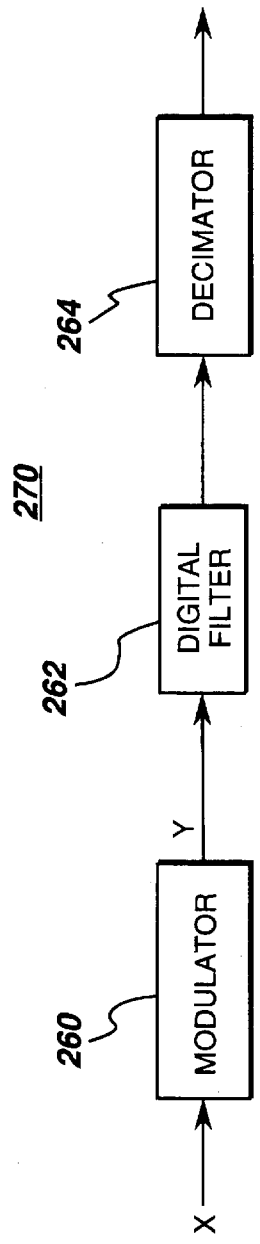
FIG. 7 is a block diagram of a delta sigma analog-to-digital converter utilizing a modulator of the type shown in either of FIGS. 5 and 6.

FIG. 7 illustrates a modulator 260 which may be identical to modulator 200, shown in FIG. 5, or modulator 250, shown in FIG. 6, incorporated into a delta sigma analog-to-digital converter 270. A digital filter 262 performs low pass filtering on the modulator output signal. The filtered modulator output signal is decimated by a decimator 264 to produce an output signal for analog-to-digital converter 270 at a decreased sampling rate.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An oversampled interpolative modulator for receiving an input analog signal and generating an output digital signal, said modulator comprising:
    a plurality of cascaded integrators for generating an integrated analog output signal, said plurality of cascaded integrators including:
        a first summation junction for receiving an input analog signal and subtractively adding a first voltage to generate a first difference output signal;
        a first unit-delay integrator coupled to the output of said first summation junction for integrating the first difference output signal;
        a second summation junction for receiving an analog output signal from said first unit-delay integrator and subtractively adding a second voltage to generate a second difference output signal;
        a second unit-delay integrator coupled to the output of said second summation junction for integrating the second difference output signal;
        a third summation junction for receiving an analog output signal from said second unit-delay integrator and subtractively adding a third voltage to generate a third difference output signal;
        a fourth summation junction for receiving an analog output signal from said third summation junction and subtractively adding a fourth voltage to generate a fourth difference output signal; and
        a third unit-delay integrator coupled to the output of said fourth summation junction for integrating the fourth difference output signal;
    a multi-bit analog-to-digital converter coupled to receive the integrated analog output signal from said plurality of cascaded integrators;
    a multi-bit digital-to-analog converter coupled to the output of said multi-bit analog-to-digital converter, the analog output of said multi-bit digital-to-analog converter being coupled to said fourth summation junction;
    a truncator coupled to the output of said multi-bit analog-to-digital converter; and
    a one-bit digital-to-analog converter coupled to the output of said truncator for converting the digital output signal of said truncator to an analog signal, the output of said one-bit digital-to-analog converter being coupled to said first, second and third summation junctions.

2. The oversampled interpolative modulator of claim 1, further comprising a fifth summation junction coupled to receive the output of said multi-bit analog-to-digital converter and the output of said truncator, the output of said fifth summation junction being coupled to a truncation corrector for digitally correcting the error due to said truncator.

3. The oversampled interpolative modulator of claim 2, further comprising a sixth summation junction coupled to the output of said truncation corrector and the output of said multi-bit analog-to-digital converter.

4. The oversampled interpolative modulator of claim 1 wherein said first unit-delay integrator employs a first scaling factor $k_1$ and said second unit-delay integrator employs a second scaling factor $k_2$.

5. The oversampled interpolative modulator of claim 4 further comprising a fifth summation junction coupled to receive the output of said multi-bit analog-to-digital converter and the output of said truncator, the output of said fifth summation junction being coupled to a truncation corrector for digitally correcting error due to said truncator by using the output of said fifth summation junction, said modulator further comprising a sixth summation junction coupled to the output of said truncation corrector and the output of said multi-bit analog-to-digital converter.

6. A delta sigma analog-to-digital converter comprising:
    an oversampled interpolative modulator for receiving an input analog signal to be converted and generating an output digital signal;
    a digital filter coupled to receive the output digital signal of said oversampled interpolative modulator for generating a filtered digital output signal; and
    a decimator coupled to receive the filtered digital output signal of said digital filter for reducing the sampling rate of said filtered digital output signal, said oversampled interpolative modulator comprising:
        a plurality of cascaded integrators for generating an integrated analog output signal, said plurality of cascaded integrators including:
            a first summation junction for receiving an input analog signal and subtractively adding a first voltage to generate a first difference output signal;
            a first unit-delay integrator coupled to the output of said first summation junction for integrating the first difference output signal;
            a second summation junction for receiving an analog output signal from said first unit-delay integrator and subtractively adding a second voltage to generate a second difference output signal;
            a second unit-delay integrator coupled to the output of said second summation junction for integrating the second difference output signal;
            a third summation junction for receiving an analog output signal from said second unit-delay integrator and subtractively adding a third voltage to generate a third difference output signal;
            a fourth summation junction for receiving an analog output signal from said third summation junction and subtractively adding a fourth voltage to generate a fourth difference output signal;
            a third unit-delay integrator coupled to the output of said fourth summation junction for integrating the fourth difference output signal;
        a multi-bit analog-to-digital converter coupled to receive the integrated analog output signal from said plurality of cascaded integrators;

a multi-bit digital-to-analog converter coupled to the output of said multi-bit analog-to-digital converter, the output of said multi-bit digital-to-analog converter being coupled to said fourth summation junction;

a truncator coupled to the output of said multi-bit analog-to-digital converter; and a one-bit digital-to-analog converter coupled to the output of said truncator for converting the digital output signal of said truncator to an analog signal, the output of said one-bit digital-to-analog converter being coupled to said first, second and third summation junctions.

7. The delta sigma analog-to-digital converter of claim 6 wherein said oversampled interpolative modulator further comprises a fifth summation junction coupled to the output of said multi-bit analog-to-digital converter and the output of said truncator, the output of said fifth summation junction coupled to a truncation corrector for digitally correcting error due to said truncator by using the output of said fifth summation junction.

8. The delta sigma analog-to-digital converter of claim 7 wherein said oversampled interpolative modulator further comprises a sixth summation junction coupled to the output of said truncation corrector and the output of said multi-bit analog-to-digital converter.

9. The delta sigma analog-to-digital converter of claim 8 wherein said first unit-delay integrator comprises a first scaled integrator of scaling factor $k_I$ and said second unit-delay integrator comprises a second scaled integrator of scaling factor $k_2$.

10. The delta sigma analog-to-digital converter of claim 9 wherein said oversampled interpolative modulator further comprises a fifth summation junction coupled to receive the output of said multi-bit analog-to-digital converter and the output of said truncator, the output of said fifth summation junction being coupled to a truncator conrrector for correcting error due to said truncator by using the output of said fifth summation junction, said modulator further comprising a sixth summation junction coupled to the output of said truncation error corrector and the output of said multi-bit analog-to-digital converter.

* * * * *